US011855355B2

(12) United States Patent
Park et al.

(10) Patent No.: US 11,855,355 B2
(45) Date of Patent: Dec. 26, 2023

(54) ANTENNA APPARATUS

(71) Applicants: Samsung Electro-Mechanics Co., Ltd., Suwon-si (KR); Seoul National University R&DB Foundation, Seoul (KR)

(72) Inventors: Ju Hyoung Park, Suwon-si (KR); Jung Woo Seo, Seoul (KR); Jung Suek Oh, Seoul (KR); Jeong Ki Ryoo, Suwon-si (KR); Kyu Bum Han, Suwon-si (KR)

(73) Assignees: Samsung Electro-Mechanics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 23 days.

(21) Appl. No.: 17/564,791

(22) Filed: Dec. 29, 2021

(65) Prior Publication Data

US 2022/0123480 A1 Apr. 21, 2022

Related U.S. Application Data

(63) Continuation of application No. 16/662,528, filed on Oct. 24, 2019, now Pat. No. 11,245,201.

(30) Foreign Application Priority Data

Jun. 26, 2019 (KR) ........................ 10-2019-0076303

(51) Int. Cl.
*H01Q 15/16* (2006.01)
*H01Q 21/06* (2006.01)
(Continued)

(52) U.S. Cl.
CPC ........... *H01Q 21/065* (2013.01); *H01Q 1/241* (2013.01); *H01Q 1/48* (2013.01); *H01Q 21/0006* (2013.01)

(58) Field of Classification Search
CPC .... H01Q 9/0414; H01Q 9/045; H01Q 21/065; H01Q 1/38; H01Q 1/243; H01Q 1/2283;
(Continued)

(56) References Cited

U.S. PATENT DOCUMENTS 10,181,646 B2 1/2019 Celik
11,031,675 B2 * 6/2021 Kim ..................... H01Q 21/065
(Continued)

FOREIGN PATENT DOCUMENTS

JP 2014-527366 A 10/2014
KR 10-2011-0005250 A 1/2011
(Continued)

OTHER PUBLICATIONS

Korean Office Action dated Apr. 10, 2020 in corresponding Korean Patent Application No. 10-2019-0076303 (5 pages in English, 4 pages in Korean).
(Continued)

*Primary Examiner* — Linh V Nguyen
(74) *Attorney, Agent, or Firm* — NSIP Law

(57) ABSTRACT

An antenna apparatus includes a patch antenna pattern; a first feed via to feed power to the patch antenna pattern in a non-contact manner on a first side of the patch antenna pattern; and a plurality of feed patterns disposed on the first side of the patch antenna pattern on different levels and overlapping each other, and including at least one feed pattern that is electrically connected to the first feed via, and each having a width greater than a width of the first feed via and a cross-sectional area smaller than a cross-sectional area of the patch antenna pattern.

15 Claims, 12 Drawing Sheets

(51) Int. Cl.

| | |
|---|---|
| ***H01Q 1/24*** | (2006.01) |
| ***H01Q 1/48*** | (2006.01) |
| ***H01Q 21/00*** | (2006.01) |

(58) Field of Classification Search
CPC .... H01Q 9/0407; H01Q 21/28; H01Q 9/0435; H01Q 1/48; H01Q 21/24; H01Q 5/40; H01Q 5/378; H01Q 19/005; H01Q 9/0457; H01Q 1/521; H01Q 21/08; H01Q 19/24; H01Q 1/526; H01Q 25/00; H01Q 25/001; H01Q 5/35; H01Q 9/0464
USPC .................................................. 343/829, 846
See application file for complete search history.

(56) References Cited

U.S. PATENT DOCUMENTS

| | | | | |
|---|---|---|---|---|
| 2005/0195110 | A1 | 9/2005 | Lin et al. | |
| 2006/0256016 | A1 | 11/2006 | Wu et al. | |
| 2008/0136734 | A1 | 6/2008 | Manholm et al. | |
| 2009/0058731 | A1 | 3/2009 | Geary et al. | |
| 2009/0256752 | A1 | 10/2009 | Akkermans et al. | |
| 2013/0063310 | A1 | 3/2013 | Mak et al. | |
| 2013/0099982 | A1 | 4/2013 | Andrenko | |
| 2014/0145883 | A1* | 5/2014 | Baks | H01L 23/66 343/700 MS |
| 2016/0049723 | A1* | 2/2016 | Baks | H01L 23/66 343/848 |
| 2018/0159203 | A1* | 6/2018 | Baks | H01Q 9/045 |
| 2018/0205155 | A1 | 7/2018 | Mizunuma et al. | |
| 2018/0316098 | A1* | 11/2018 | Amadjikpe | H01Q 19/005 |
| 2019/0020110 | A1 | 1/2019 | Paulotto et al. | |
| 2019/0027802 | A1* | 1/2019 | Noori | H01Q 19/005 |
| 2019/0165475 | A1 | 5/2019 | Shibata | |
| 2019/0305432 | A1* | 10/2019 | Kim | H01Q 1/38 |
| 2020/0220249 | A1 | 7/2020 | Asaf et al. | |
| 2020/0220270 | A1* | 7/2020 | Onaka | H01Q 1/422 |
| 2020/0295463 | A1* | 9/2020 | Yamada | H01Q 21/0025 |
| 2020/0303821 | A1* | 9/2020 | Lee | H01Q 5/335 |
| 2020/0328518 | A1* | 10/2020 | Park | H01Q 9/0414 |
| 2021/0168932 | A1* | 6/2021 | Woo | H01Q 9/0457 |
| 2021/0313696 | A1* | 10/2021 | Chang | B32B 7/025 |

FOREIGN PATENT DOCUMENTS

| | | | |
|---|---|---|---|
| KR | 10-1164618 | B1 | 7/2012 |
| WO | WO 2017/047396 | A1 | 3/2017 |

OTHER PUBLICATIONS

Korean Office Action dated Sep. 21, 2022, in counterpart Korean Patent Application No. 10-2021-0007229 (3 pages in English and 5 pages in Korean).

* cited by examiner

ANTENNA APPARATUS

CROSS-REFERENCE TO RELATED APPLICATIONS

This application is a continuation of U.S. patent application Ser. No. 16/662,528, filed on Oct. 24, 2019, now U.S. Pat. No. 11,245,201, which claims the benefit under 35 USC 119(a) of Korean Patent Application No. 10-2019-0076303 filed on Jun. 26, 2019 in the Korean Intellectual Property Office, the entire disclosures of which are incorporated herein by reference for all purposes.

BACKGROUND

1. Field

The following description relates to an antenna apparatus.

2. Description of Background

Mobile communications data traffic has increased on an annual basis. Various techniques have been developed to support the rapid increase in data in wireless networks in real time. For example, conversion of Internet of Things (IoT)-based data into contents, augmented reality (AR), virtual reality (VR), live VR/AR linked with SNS, an automatic driving function, applications such as a sync view (transmission of real-time images at a user viewpoint using a compact camera), and the like, may require communications (e.g., 5G communications, mmWave communications, and the like) which support the transmission and reception of large volumes of data.

Accordingly, there has been a large amount of research on mmWave communications including 5th generation (5G), and the research into the commercialization and standardization of an antenna apparatus for implementing such communications has been increasingly conducted.

A radio frequency (RF) signal of a high frequency band (e.g., 24 GHz, 28 GHz, 36 GHz, 39 GHz, 60 GHz, and the like) may easily be absorbed and lost during transmission, which may degrade the quality of communications. Thus, an antenna for communications performed in a high frequency band may require a technical approach different from techniques used in a general antenna, and a special technique such as a separate power amplifier, and the like, may be required to secure antenna gain, integration of an antenna and a radio frequency integrated circuit (RFIC), effective isotropic radiated power (EIRP), and the like.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An antenna apparatus which may provide a transmission and reception configuration for a plurality of different frequency bands, may improve an antenna performance, and/or may be easily miniaturized.

In one general aspect, an antenna apparatus includes a patch antenna pattern; a first feed via to feed power to the patch antenna pattern in a non-contact manner on a first side of the patch antenna pattern; and a plurality of feed patterns disposed on the first side of the patch antenna pattern on different levels and overlapping each other, and including at least one feed pattern that is electrically connected to the first feed via, and each having a width greater than a width of the first feed via and a cross-sectional area smaller than a cross-sectional area of the patch antenna pattern.

The antenna apparatus may include a second feed via to feed power to the patch antenna pattern in a non-contact manner on the first side of the patch antenna pattern, and disposed adjacent a first edge of the patch antenna pattern offset from a center of the patch antenna pattern in a second direction. The first feed via may be disposed adjacent to a second edge of the patch antenna pattern offset from the center of the patch antenna pattern in a first direction different from the second direction.

The antenna apparatus may include a ground plane including a through-hole through which the first feed via penetrates, and disposed on the first side of the patch antenna pattern on a level spaced farther away from the patch antenna apparatus than at least one of the plurality of feed patterns.

The cross-sectional area of each of the plurality of feed patterns may be greater than a cross-sectional area of the through-hole.

The cross-sectional areas of the plurality of feed patterns may be different from each other.

The antenna apparatus may include a ground plane including a through-hole through which the first feed via penetrates, and the plurality of feed patterns may include at least one feed pattern disposed in the through-hole having a cross-sectional area smaller than at least one feed pattern not disposed in the through-hole.

The antenna apparatus may include a plurality of first coupling patterns disposed on different levels and overlapping each other, and arranged to surround the patch antenna pattern.

At least one coupling pattern of the plurality of first coupling patterns may be disposed on a same level as a level of the patch antenna pattern, and the plurality of first coupling patterns other than the at least one coupling pattern may be disposed on the first side of the patch antenna pattern on levels corresponding to the different levels of the plurality of feed patterns.

The antenna apparatus may include a plurality of second coupling patterns disposed on different levels and overlapping each other, and arranged to surround the plurality of first coupling patterns.

The plurality of first and second coupling patterns may be disposed only on a same level as the patch antenna pattern or on levels spaced apart from the first side of the patch antenna pattern.

The antenna apparatus may include a ground plane including a through-hole through which the first feed via penetrates and disposed on the first side of the patch antenna pattern on a level spaced farther away from the patch antenna apparatus the plurality of feed patterns, and the plurality of first coupling patterns and the plurality of second coupling patterns may be electrically disconnected from the ground plane.

A cross-sectional area of each of the plurality of first coupling patterns may be different from a cross-sectional area of each of the plurality of second coupling patterns.

The patch antenna pattern may include a plurality of patch antenna patterns, the plurality of patch antenna patterns may be arranged in an N×1 structure in a first direction normal to a thickness direction of the patch antenna patterns or a second direction normal to a thickness direction of the patch antenna patterns and the first direction, where N is a natural number greater than or equal to 2, and the plurality of first coupling patterns may be divided into a plurality of groups, and the plurality of groups of the first coupling patterns may surround each of the plurality of patch antenna patterns.

The plurality of groups of the plurality of first coupling patterns may be spaced apart from each other by a length greater than a length of a spacing distance between the plurality of first coupling patterns, and at least a portion of the plurality of second coupling patterns may be disposed between the plurality of groups of the plurality of first coupling patterns.

The patch antenna pattern may include a plurality of end-fire antenna patterns spaced apart from the plurality of patch antenna patterns in the first direction and arranged in the second direction.

The cross-sectional area of a first coupling pattern of the plurality of first coupling patterns spaced apart from the patch antenna patterns in the first direction may be less than the cross-sectional area of a second coupling pattern of the plurality of second coupling patterns spaced apart from the patch antenna patterns in the first direction, and the cross-sectional area of a first coupling pattern of the plurality of first coupling patterns spaced apart from the patch antenna patterns in the second direction may be greater than the cross-sectional area of a second coupling pattern of the plurality of second coupling patterns spaced apart from the patch antenna patterns in the second direction.

In another general aspect, an antenna apparatus includes a patch antenna pattern; a first feed via to feed power to the patch antenna pattern in a non-contact manner and disposed adjacent to a first surface of the patch antenna pattern; first feed patterns electrically connected to the first feed via and spaced apart from the first surface of the patch antenna pattern at different levels in a thickness direction of the patch antenna pattern; first coupling patterns coplanar with the patch antenna pattern and surrounding the patch antenna pattern while being spaced apart from the patch antenna pattern in both a first direction normal to the thickness direction of the patch antenna pattern and a second direction normal to the thickness direction of the patch antenna pattern and the first direction; and second coupling patterns aligned with the first coupling patterns in the thickness direction of the patch antenna pattern and disposed at different levels corresponding to the different levels of the first feed patterns.

The first feed via may be offset from a center of the patch antenna pattern in the first direction.

The antenna may include: a first feed via to feed power to the patch antenna pattern in a non-contact manner and disposed adjacent to the first surface of the patch antenna pattern and offset from the center of the patch antenna pattern in the second direction; and second feed patterns electrically connected to the second feed via and spaced apart from the first surface of the patch antenna pattern at different levels in the thickness direction of the patch antenna pattern corresponding to the different levels of the first feed patterns.

The antenna may include: third coupling patterns coplanar with the patch antenna pattern and surrounding the first coupling patterns while being spaced apart from the first coupling patterns in both the first direction and the second direction; and fourth coupling patterns aligned with the third coupling patterns in the thickness direction of the patch antenna pattern and disposed at different levels corresponding to the different levels of the first feed patterns.

Other features and aspects will be apparent from the following detailed description, the drawings, and the claims.

BRIEF DESCRIPTION OF DRAWINGS

FIG. 10 is a perspective view illustrating combination of the non-contact power feed structure illustrated in FIG. 1A and the first and second coupling patterns illustrated in FIG. 1B.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
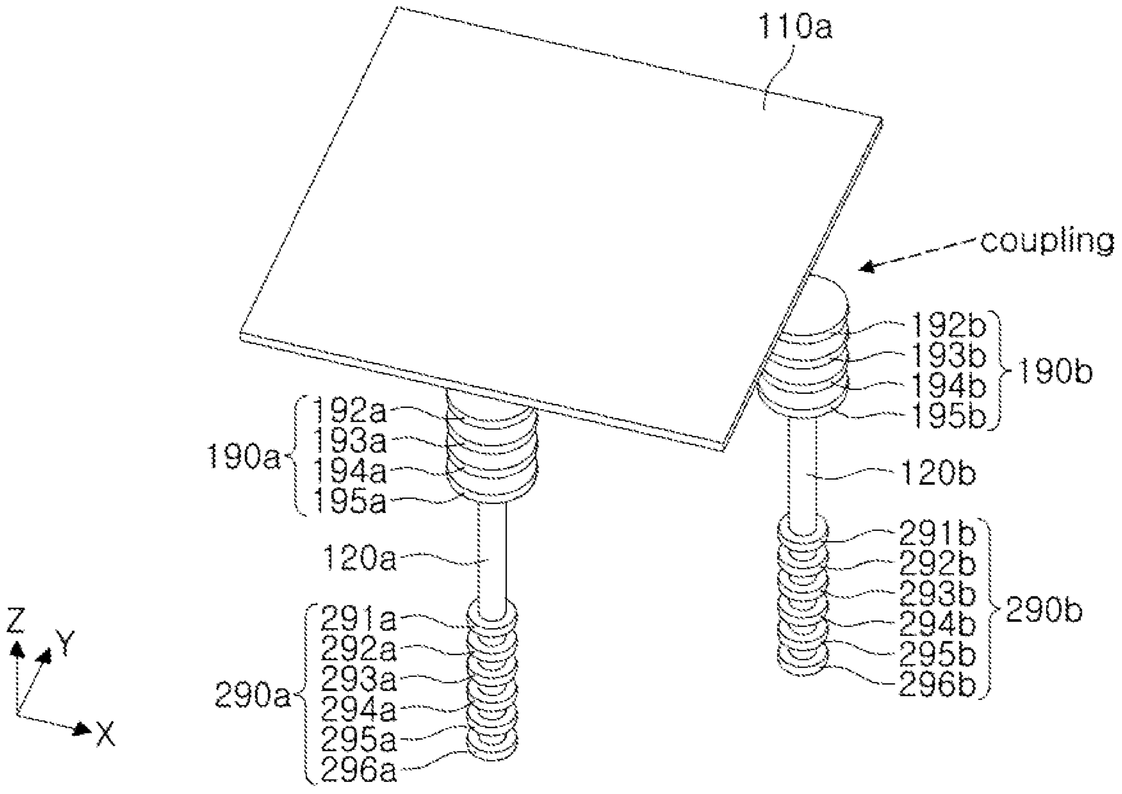
FIG. 1A is a perspective view illustrating a non-contact power feed structure of an antenna apparatus according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term “may” with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described as follows with reference to the attached drawings.

FIG. 1A is a perspective view illustrating a non-contact power feed structure of an antenna apparatus according to an example.

Referring to FIG. 1A, an antenna apparatus may include a patch antenna pattern 110*a*, a first feed via 120*a*, and a plurality of first feed patterns 190*a*.

The patch antenna pattern 110*a* may receive a radio frequency (RF) signal from the first feed via 120*a* and may remotely transmit the RF signal in a z direction or may transmit a remotely received RF signal to the first feed via 120*a*.

An upper surface of the patch antenna pattern 110*a* may work as a space on which a surface current flows, and the surface current may be radiated into the air in a normal direction of the upper surface of the patch antenna pattern 110*a* in accordance with resonance of the patch antenna pattern 110*a*.

The patch antenna pattern 110*a* may have a bandwidth based on an intrinsic resonance frequency determined by intrinsic elements (e.g., a form, a size, a thickness, a spacing distance, a dielectric constant of an insulating layer, and the like) and an extrinsic resonance frequency determined by an electromagnetic coupling with an adjacent pattern and/or a via.

The number of the intrinsic resonance frequency and the number of the extrinsic resonance frequency may be two or more. Accordingly, even when there is only a single patch antenna pattern 110*a*, transmission and reception for a plurality of different frequency bands may be implemented.

Thus, when there is a plurality of patch antenna patterns 110*a*, the patch antenna patterns 110*a* have a plurality of different bandwidths, the patch antenna patterns 110*a* may remotely transmit and receive first and second RF signals having different frequencies (e.g., 28 GHz and 39 GHz).

The first feed via 120*a* may provide an electrical connection patch between an integrated circuit (IC) and the patch antenna pattern 110*a*, and may work as a transmission line for the first and second RF signals.

The first feed via 120*a* may feed power to the patch antenna pattern 110*a* in a non-contact manner on a lower side of the patch antenna pattern 110*a*. Thus, the first feed via 120*a* may not be in contact with the patch antenna pattern 110*a*.

Thus, impedance between the first feed via 120*a* and the patch antenna pattern 110*a* may include capacitance formed by the first feed via 120*a* and the patch antenna pattern 110*a*. Accordingly, when transmission line impedance determined by combination of inductance corresponding to a length of the first feed via 120*a* and the capacitance is close to a certain impedance (e.g., 50Ω), the first feed via 120*a* may transmit the first and second RF signals to the patch antenna pattern 110*a* or may receive the first and second RF signals from the patch antenna pattern 110*a*, even though the first feed via 120*a* is not in contact with the patch antenna pattern 110*a*.

At least a portion of the plurality of first feed patterns 190*a* may be electrically connected to the first feed via 120*a*.

Each of the plurality of first feed patterns 190*a* may have a width greater than a width of the first feed via 120*a* and may have an area smaller than an area of the patch antenna pattern 110*a*. Accordingly, impedance (e.g., capacitance) between the plurality of first feed patterns 190*a* and the patch antenna pattern 110*a* may correspond to an area of each of the plurality of first feed patterns 190*a*.

Capacitance between the plurality of first feed patterns 190*a* and the patch antenna pattern 110*a* may work as a factor affecting a resonance frequency of the patch antenna pattern 110*a*. Thus, a resonance frequency of the patch antenna pattern 110*a* may correspond to an area of each of the plurality of first feed patterns 190*a*.

Also, the plurality of first feed patterns 190*a* may be disposed on different levels and may overlap each other. Accordingly, the plurality of first feed patterns 190*a* may have different spacing distances to the patch antenna pattern 110*a*, and may thus have different capacitances.

For examples, 1-1th, 1-2th, 1-3th, and 1-4th feed patterns 192*a*, 193*a*, 194*a*, and 195*a* of the plurality of first feed patterns 190*a* may be disposed on different levels, and accordingly, the 1-1th, 1-2th, 1-3th, and 1-4th feed patterns 192*a*, 193*a*, 194*a*, and 195*a* may provide a plurality of different levels of capacitance to the patch antenna pattern 110*a*. In an example, areas of some of the 1-1th, 1-2th, 1-3th, and 1-4th feed patterns 192*a*, 193*a*, 194*a*, and 195*a* may be different from areas of other of the feed patterns 192*a*, 193*a*, 194*a*, and 195*a*.

The plurality of different levels of capacitances may provide an electromagnetic environment in which the patch antenna pattern 110*a* may have a plurality of different resonance frequencies. Accordingly, the patch antenna pattern 110*a* may remotely transmit and receive the first and second RF signals having different frequencies together.

Thus, the antenna apparatus in the example may provide a transmit and reception configuration for a plurality of different frequency bands even when an additional patch pattern is not provided. Accordingly, the antenna apparatus may have a reduced size, as an additional patch pattern is not provided.

The antenna apparatus may further include a second feed via 120*b* and a plurality of second feed patterns 190*b*.

The second feed via 120*b* may feed power to the patch antenna pattern 110*a* in a non-contact manner on a lower side of the patch antenna pattern 110*a*, and may be disposed adjacent to one side from a center of the patch antenna pattern 110*a* in a second direction (e.g., an X direction). The first feed via 120*a* may be disposed adjacent to one side from a center of the patch antenna pattern 110*a* in the first direction (e.g., a Y direction).

Accordingly, a 1-1th RF signal and/or a 2-1th RF signal transmitted from the first feed via 120*a* and a 1-2th RF signal and/or a 2-2th RF signal transmitted from the second feed via 120*b* may form polarized waves. The 1-1th RF signal and/or a 2-1th RF signal may be defined as horizontal polarization (H pol.) RF signals, and the 1-2th RF signal and/or a 2-2th RF signal may be defined as vertical polarization (V pol.) RF signals.

A first surface current corresponding to the 1-1th RF signal and/or a 2-1th RF signal flowing on the patch antenna pattern 110*a* and a second surface current corresponding to the 1-2th RF signal and/or a 2-2th RF signal may be orthogonal to each other, and may be irradiated in the z direction. An electric field of when the 1-1th RF signal and/or a 2-1th RF signal is irradiated and an electric field of when the 1-2th RF signal and/or a 2-2th RF signal is irradiated may be orthogonal to each other, and a magnetic field of when the 1-1th RF signal and/or a 2-1th RF signal is irradiated and a magnetic field of when the 1-2th RF signal and/or a 2-2th RF signal is irradiated may be orthogonal to each other. Accordingly, the 1-1th RF signal and/or a 2-1th RF signal may not cause electromagnetic interference with respect to the 1-2th RF signal and/or a 2-2th RF signal, and the 1-2th RF signal and/or a 2-2th RF signal may not cause electromagnetic interference with respect to the 1-1th RF signal and/or a 2-1th RF signal.

For example, 2-1th, 2-2th, 2-3th, and 2-4th feed patterns 192*b*, 193*b*, 194*b*, and 195*b* of the plurality of second feed patterns 190*b* may be disposed on different levels, and may thus provide a plurality of different levels of capacitance to the patch antenna pattern 110*a*.

Areas of some of the 2-1th, 2-2th, 2-3th, and 2-4th feed patterns 192*b*, 193*b*, 194*b*, and 195*b* may be different from areas of the other of the 2-1th, 2-2th, 2-3th, and 2-4th feed patterns 192*b*, 193*b*, 194*b*, and 195*b*.

The plurality of different levels of capacitance may provide an electromagnetic environment in which the patch antenna pattern 110*a* may have a plurality of different resonance frequencies. Accordingly, the patch antenna pattern 110*a* may remotely transmit and receive a 1-1th RF signal, a 1-2th RF signal, a 2-1th RF signal, and a 2-2th RF signal together.

The first and second feed vias 120*a* and 120*b* may include third and fourth feed patterns 290*a* and 290*b* disposed on a level lower (in the Z-direction) than a level of the first and second feed patterns 190*a* and 190*b*. The third and fourth feed patterns 290*a* and 290*b* may have an area smaller than an area of each of the plurality of first and second feed patterns 190*a* and 190*b*. Accordingly, the patch antenna pattern 110*a* may be provided with various levels of capacitance.

The plurality of third feed patterns 290*a* may include 3-1th, 3-2th, 3-3th, 3-4th, 3-5th, and 3-6th feed patterns 291*a*, 292*a*, 293*a*, 294*a*, 295*a*, and 296*a*, and the plurality of fourth feed patterns 290*b* may include 4-1th, 4-2th, 4-3th, 4-4th, 4-5th, 4-6th feed patterns 291*b*, 292*b*, 293*b*, 294*b*, 295*b*, and 296*b*. However, a configuration is not limited thereto, and the plurality of third and fourth feed patterns 290*a* and 290*b* may not be provided.

Figure 1B:
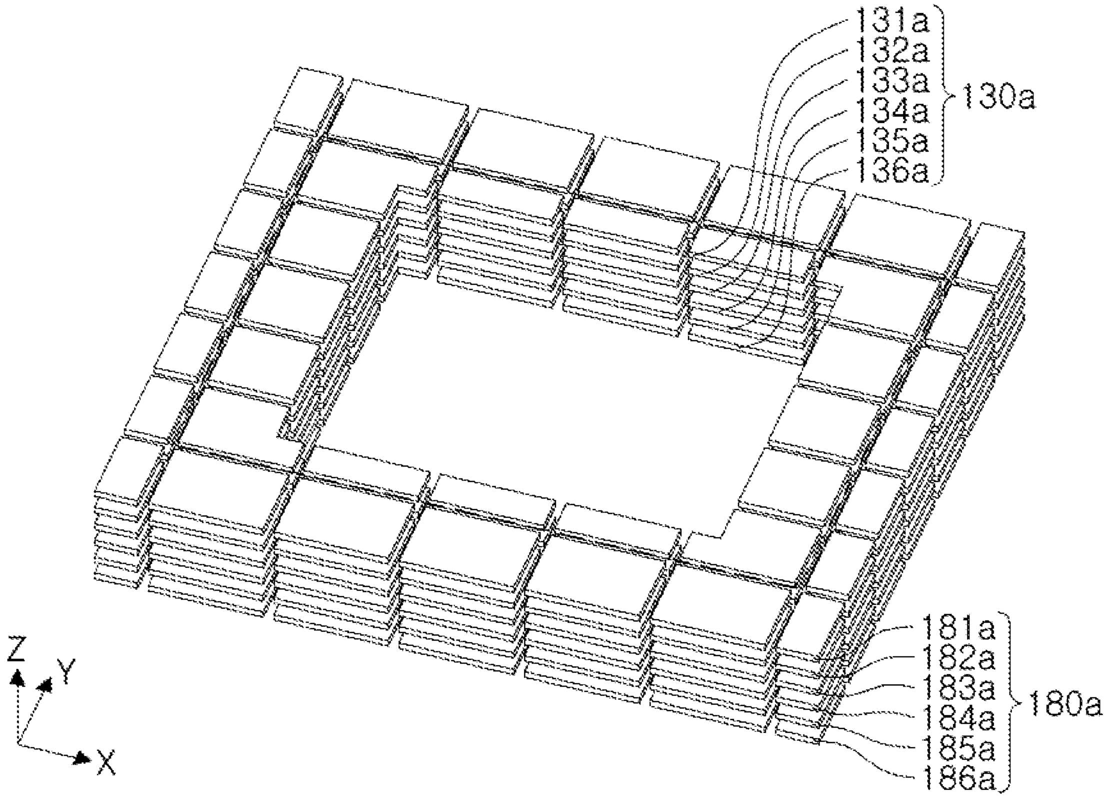
FIG. 1B is a perspective view illustrating a plurality of first and second coupling patterns of an antenna apparatus.
Figure 1C:
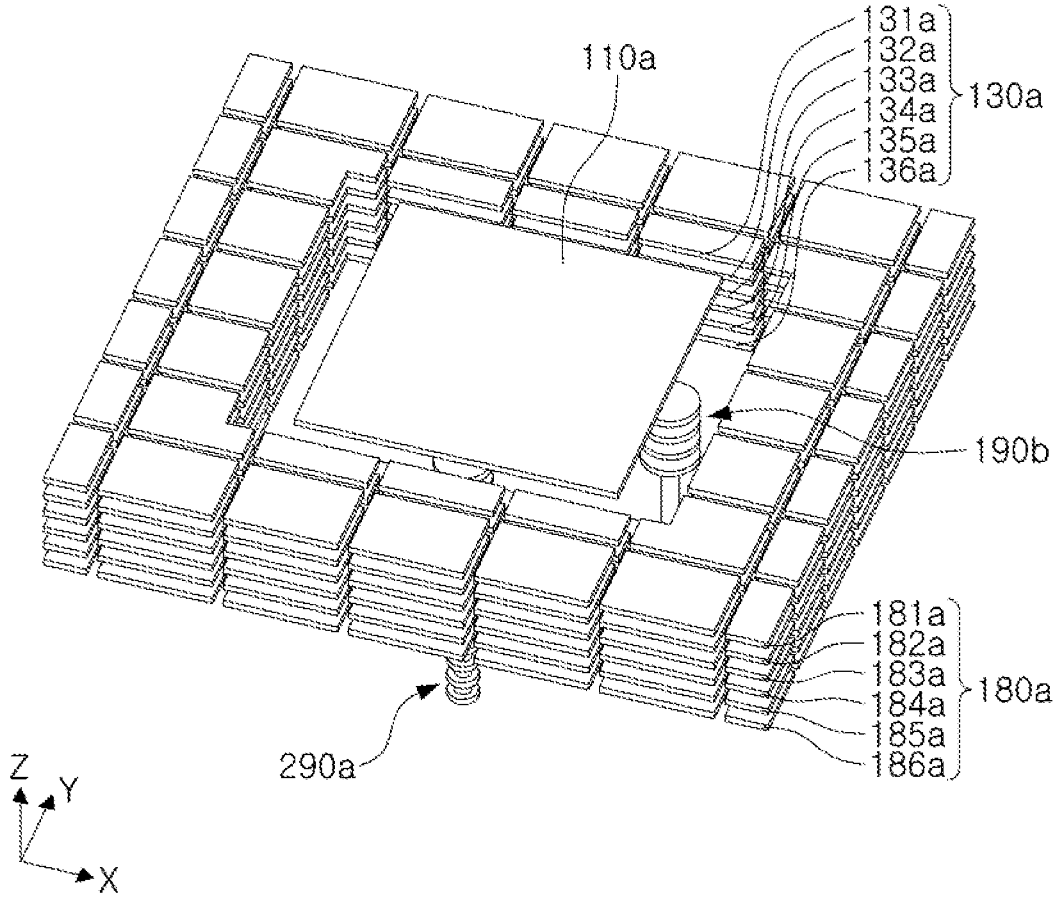
FIG. 1D is a perspective view illustrating combination of the antenna apparatus illustrated in FIG. 10 and a connection member.
FIG. 1E is a perspective view illustrating an N×1 arrangement structure of the antenna apparatus illustrated in FIG. 1D.

FIG. 1B is a perspective view illustrating a plurality of first and second coupling patterns of an antenna apparatus according to an example, and FIG. 10 is a perspective view illustrating a combination of the non-contact power feed structure illustrated in FIG. 1A and the first and second coupling patterns illustrated in FIG. 1B.

Referring to FIGS. 1B and 10, an antenna apparatus may further include a plurality of first coupling patterns 130*a* and a plurality of second coupling patterns 180*a*.

The plurality of first coupling patterns 130*a* may be arranged to surround the patch antenna pattern 110*a*, and may be disposed on different levels (in the Z-direction) and may overlap each other. For example, the plurality of first coupling patterns 130*a* may overlap each other in the Z direction, and may include 1-1th, 1-2th, 1-3th, 1-4th, 1-5th, and 1-6th coupling patterns 131*a*, 132*a*, 133*a*, 134*a*, 135*a*, and 136*a*.

The plurality of first coupling patterns 130*a* may be electromagnetically coupled to the first and second feed patterns 190*a* and 190*b* and the patch antenna pattern 110*a*, and may thus support an electromagnetic coupling between the first and second feed patterns 190*a* and 190*b* and the patch antenna pattern 110*a*.

Accordingly, an electromagnetic coupling between the first and second feed patterns 190*a* and 190*b* and the patch antenna pattern 110*a* may greatly affect a resonance frequency of the patch antenna pattern 110*a*. Thus, a gain/and or a bandwidth of the patch antenna pattern 110*a* related to the first and second RF signals having different frequencies may improve.

The plurality of second coupling patterns 180*a* may be arranged to surround the plurality of first coupling patterns 130*a* and may be disposed on different levels (in the Z-direction) and may overlap each other. For example, the plurality of second coupling patterns 180*a* may overlap each other in the Z direction, and may include 2-1th, 2-2th, 2-3th, 2-4th, 2-5th, and 2-6th coupling patterns 181*a*, 182*a*, 183*a*,

184*a*, 185*a*, and 186*a* overlapping one another in the Z direction and surrounding the plurality of first coupling patterns 130*a*, respectively.

The first and second coupling patterns 130*a* and 180*a* may reflect first and second RF signals leaking from the patch antenna pattern 110*a* in a horizontal direction (e.g., an X direction and/or a Y direction), and accordingly, a direction in which a radiation pattern of the patch antenna pattern 110*a* is formed may be more focused in the Z direction.

As each of the first and second coupling patterns 130*a* and 180*a* has a repetitive arrangement structure, the first and second coupling patterns 130*a* and 180*a* may have electromagnetic band-gap properties. The electromagnetic band-gap properties may have a negative refractive rate with respect to an RF signal having a certain frequency, and may selectively increase an electromagnetic shielding performance related to an RF signal having a certain frequency.

Figure 1D:
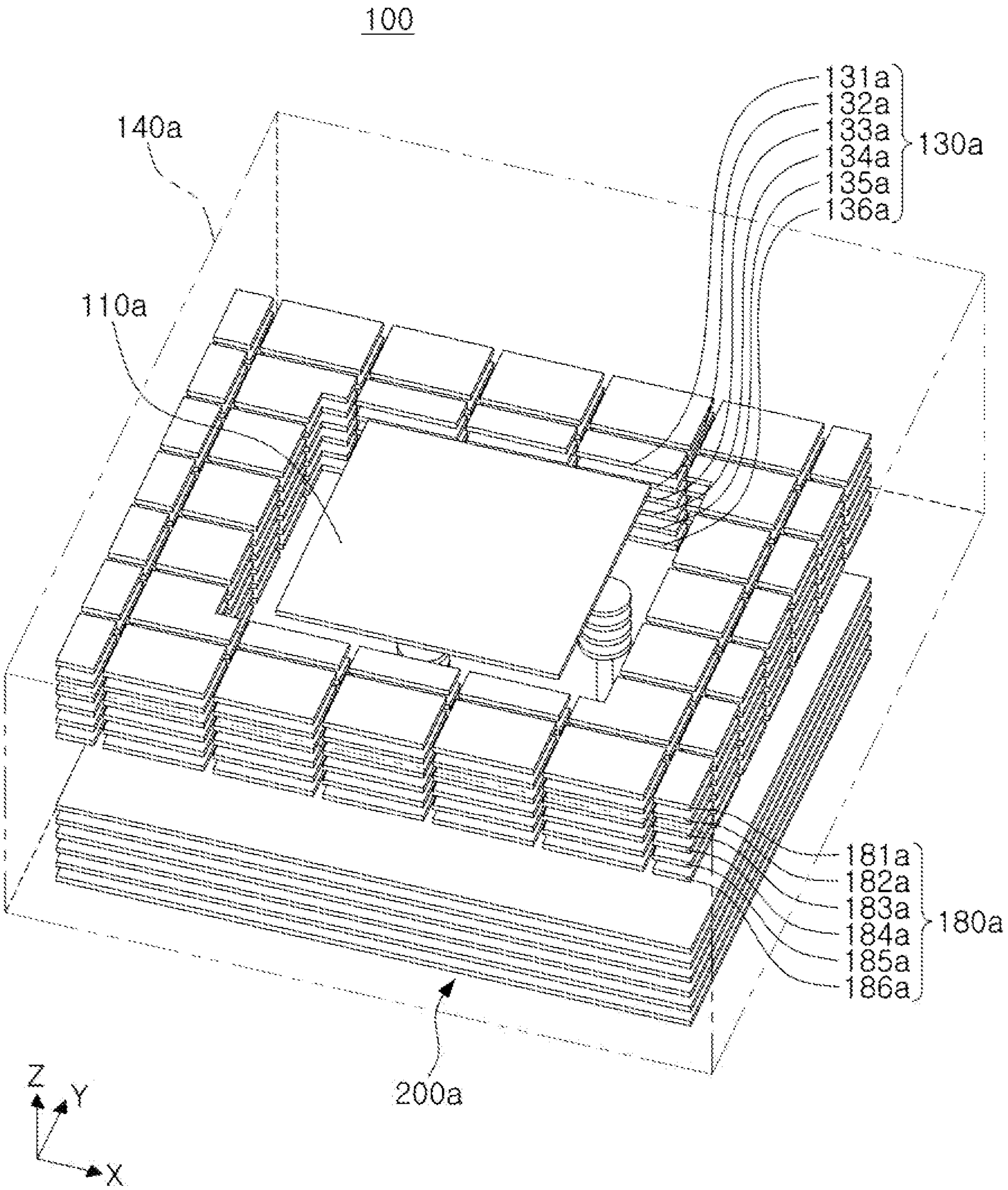

FIG. 1D is a perspective view illustrating combination of an antenna apparatus illustrated in FIG. 10 and a connection member.

Referring to FIG. 1D, an antenna apparatus 100 may include the patch antenna pattern 110*a*, a dielectric layer 140*a*, the plurality of first coupling patterns 130*a*, the plurality of second coupling patterns 180*a*, and a connection member 200*a*.

The connection member 200*a* may include a plurality of ground planes, and may be disposed on a level lower (in the Z direction) than a level of the first and second feed patterns 190*a* and 190*b*.

The dielectric layer 140*a* may fill at least a portion of an empty space of the antenna apparatus 100.

Figure 1E:
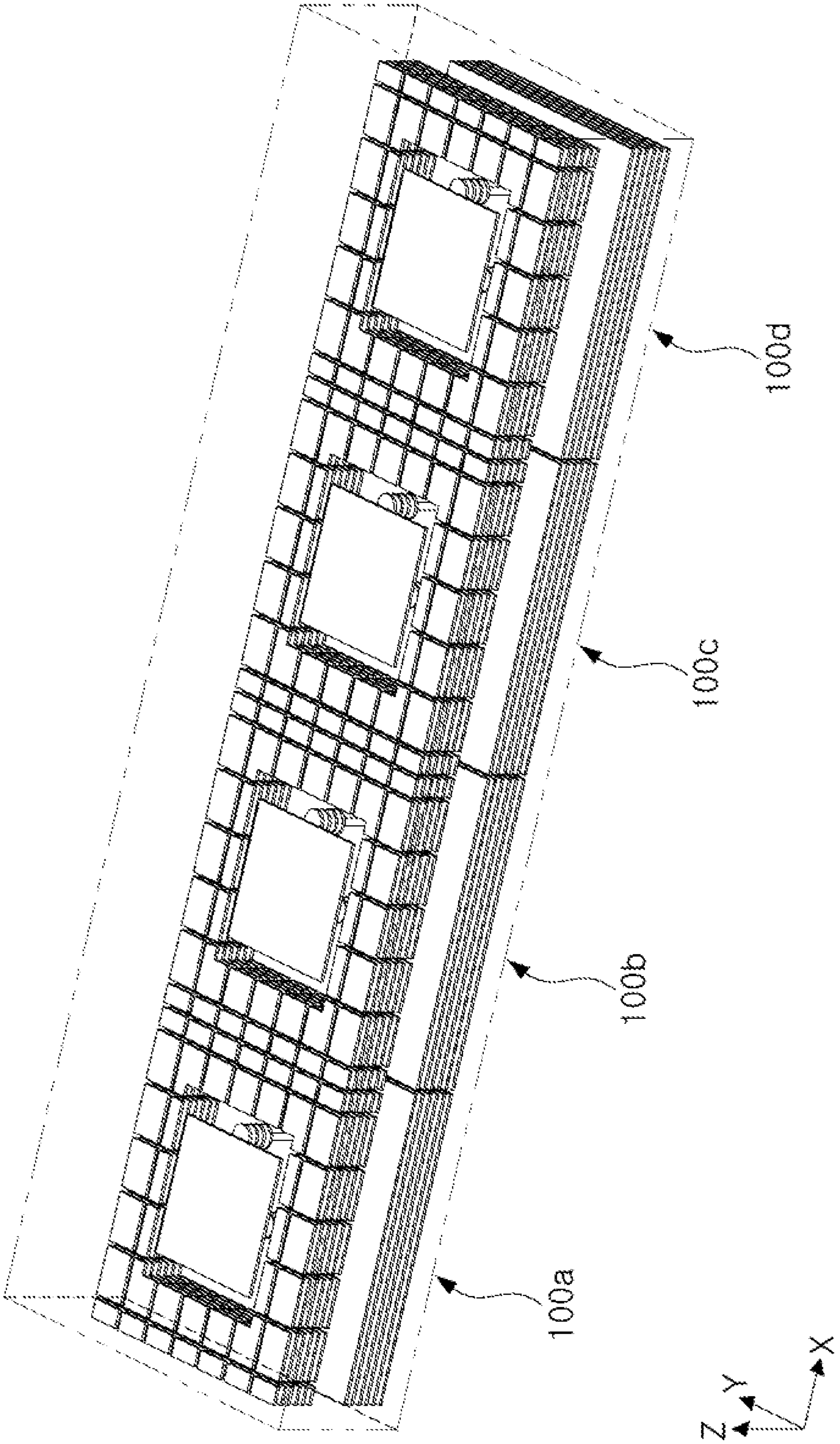

FIG. 1E is a perspective view illustrating an N×1 arrangement structure of an antenna apparatus illustrated in FIG. 1D.

Referring to FIG. 1E, antenna apparatuses 100*a*, 100*b*, 100*c*, and 100*d* may be arranged in an N×1 structure in the second direction (e.g., an X direction). "N" may be a natural number, 2 or higher.

Figure 2A:
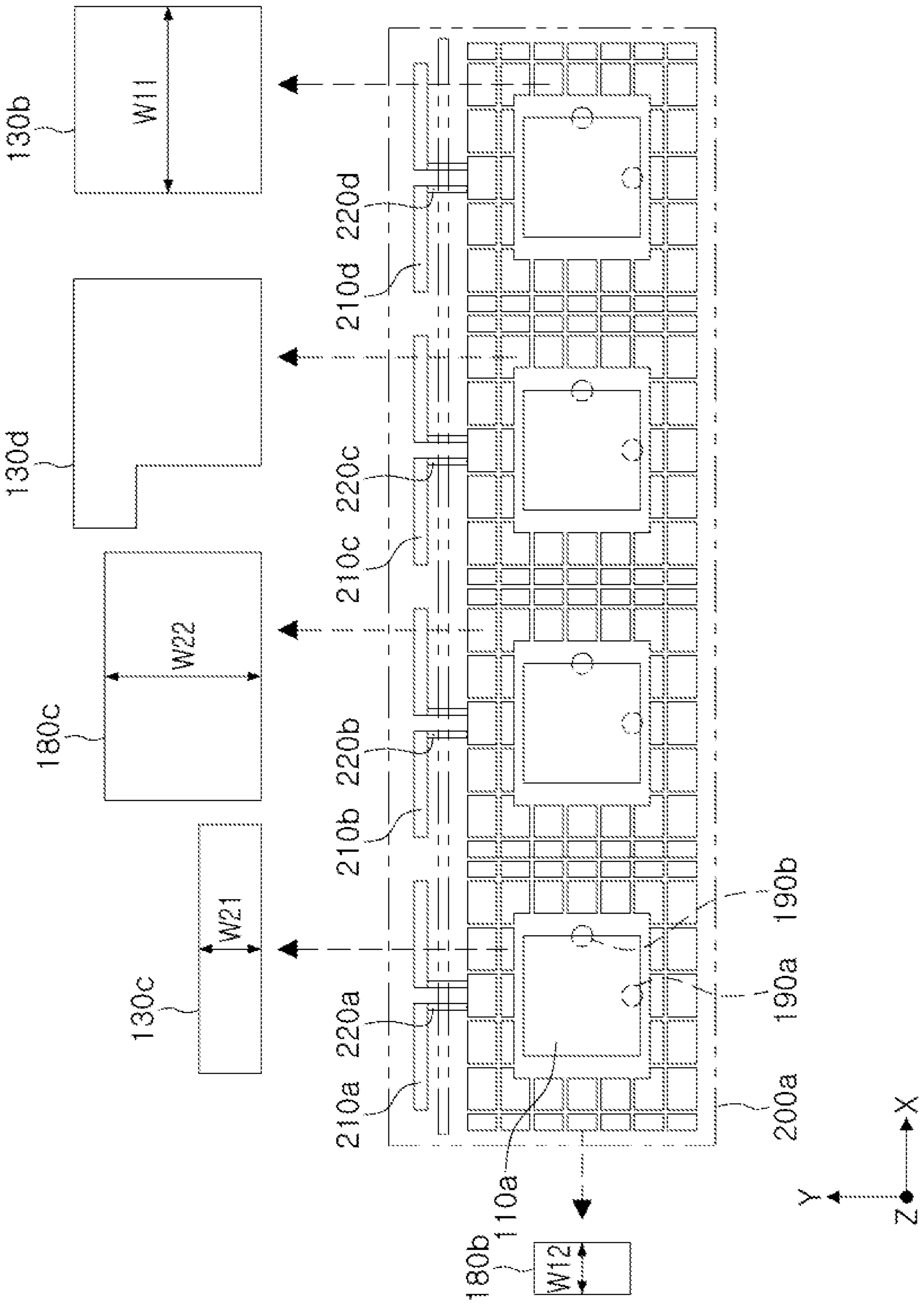
FIG. 2A is a plan view illustrating an area of each of a plurality of first and second coupling patterns of an antenna apparatus according to an example.

FIG. 2A is a plan view illustrating an area of each of a plurality of first and second coupling patterns of an antenna apparatus according to an example.

Referring to FIG. 2A, a plurality of first coupling patterns 130*b*, 130*c*, and 130*d* may be divided into a plurality of groups, and the plurality of groups of the first coupling patterns may surround each of a plurality of patch antenna patterns 110*a*. Accordingly, a gain and/or a bandwidth of each of the plurality of patch antenna patterns 110*a* related to first and second RF signals may improve.

A plurality of second coupling patterns 180*b* and 180*c* may be arranged to link the plurality of groups of the plurality of first coupling patterns 130*b*, 130*c*, and 130*d* to one another. Accordingly, the plurality of groups of the plurality of first coupling patterns 130*b*, 130*c*, and 130*d* may be spaced apart from each other by a length greater than a length of a spacing distance between the plurality of first coupling patterns, and at least a portion of the plurality of second coupling patterns 180*b* and 180*c* may be arranged between the plurality of groups.

Accordingly, the plurality of first and second coupling patterns 130*b*, 130*c*, 130*d*, 180*b*, and 180*c* may improve an electromagnetic shielding performance in the second direction (e.g., an X direction), and may thus reduce electromagnetic interference between the plurality of patch antenna patterns 110*a*.

An area of each of the plurality of first coupling patterns 130*b*, 130*c*, and 130*d* may be different from an area of each of the plurality of second coupling patterns 180*b* and 180*c*. An area of each of the plurality of first coupling patterns 130*b*, 130*c*, and 130*d* may be determined in accordance with a length W21 taken in the first direction (Y direction) and a length W11 taken in the second direction (X direction), and an area of each of the plurality of second coupling patterns 180*b* and 180*c* may be determined in accordance with a length W22 taken in the first direction (Y direction) and the length W12 taken in the second direction (X direction).

Accordingly, the plurality of first coupling patterns 130*b*, 130*c*, and 130*d* may intensively provide capacitance corresponding to a frequency of the first RF signal to the plurality of patch antenna patterns 110*a*, and the plurality of second coupling patterns 180*b* and 180*c* may intensively provide capacitance corresponding to a frequency of the second RF signal to the plurality of patch antenna patterns 110*a*. Accordingly, the plurality of patch antenna patterns 110*a* may improve a gain and/or a bandwidth related to the first and second RF signals.

For example, an area of a first coupling pattern of the plurality of first coupling patterns 130*b*, 130*c*, and 130*d* spaced apart from the patch antenna pattern 110*a* in the first direction (e.g., a Y direction) may be less than an area of a second coupling pattern of the plurality of second coupling patterns 180*b* and 180*c* spaced apart from the patch antenna pattern 110*a* in the first direction (e.g., a Y direction). For example, in FIG. 2A, an area of the first coupling pattern 130*c* may be less than an area of the second coupling pattern 180*c*.

For example, an area of a first coupling pattern of the plurality of first coupling patterns 130*b*, 130*c*, and 130*d* spaced apart from the patch antenna pattern 110*a* in the second direction (e.g., an X direction) may be greater than an area of a second coupling pattern of the plurality of second coupling patterns 180*b* and 180*c* spaced apart from the patch antenna pattern 110*a* in the second direction (e.g., an X direction). For example, in FIG. 2A, an area of the first coupling pattern 130*b* may be greater than an area of the second coupling pattern 180*b*.

Accordingly, a portion of the plurality of first coupling patterns 130*b*, 130*c*, and 130*d* may provide capacitance corresponding to the first RF signal to the patch antenna pattern 110*a*, and the other portions of the plurality of first coupling patterns 130*b*, 130*c*, and 130*d* may provide capacitance corresponding to the second RF signal to the patch antenna pattern 110*a*. A portion of the plurality of second coupling patterns 180*b* and 180*c* may provide capacitance corresponding to the second RF signal to the patch antenna pattern 110*a*, and the other portion of the plurality of second coupling patterns 180*b* and 180*c* may provide capacitance corresponding to the first RF signal to the patch antenna pattern 110*a*.

Average spacing distances of a first coupling pattern of the plurality of first coupling patterns 130*b*, 130*c*, and 130*d* corresponding to the first RF signal and a second coupling pattern of the plurality of second coupling patterns 180*b* and 180*c* corresponding to the first RF signal to the patch antenna pattern 110*a* may be similar to average spacing distances of a first coupling pattern of the plurality of first coupling patterns 130*b*, 130*c*, and 130*d* corresponding to the second RF signal and a second coupling pattern of the plurality of second coupling patterns 180*b* and 180*c* corresponding to the second RF signal to the patch antenna pattern 110*a*.

Accordingly, the patch antenna pattern 110*a* may harmoniously secure an antenna performance corresponding to the first direction and an antenna performance (e.g., a gain, a bandwidth) corresponding to the second direction, and may reduce electromagnetic interference between a surface current flowing in the first direction and a surface current flowing in the second direction, thereby implementing a polarized wave in an efficient manner.

The antenna apparatus in the example may further include a plurality of end-fire antenna patterns 210*a*, 210*b*, 210*c*, and 210*d* spaced apart from the plurality of patch antenna patterns 110*a* in the first direction (e.g., a Y direction) and arranged in the second direction (e.g., an X direction). The plurality of end-fire antenna patterns 210*a*, 210*b*, 210*c*, and 210*d* may be electrically connected to a plurality of end-fire feed lines 220*a*, 220*b*, 220*c*, and 220*d*. The plurality of end-fire feed lines 220*a*, 220*b*, 220*c*, and 220*d* may be electrically connected to an IC passing through the connection member 200*a*.

The first and second coupling patterns 130*b*, 130*c*, 130*d*, 180*b*, and 180*c* may isolate the plurality of end-fire antenna patterns 210*a*, 210*b*, 210*c*, and 210*d* from the plurality of patch antenna patterns 110*a*, and may thus improve electromagnetic isolation between the plurality of end-fire antenna patterns 210*a*, 210*b*, 210*c*, and 210*d* and the plurality of patch antenna patterns 110*a*.

Figure 2B:
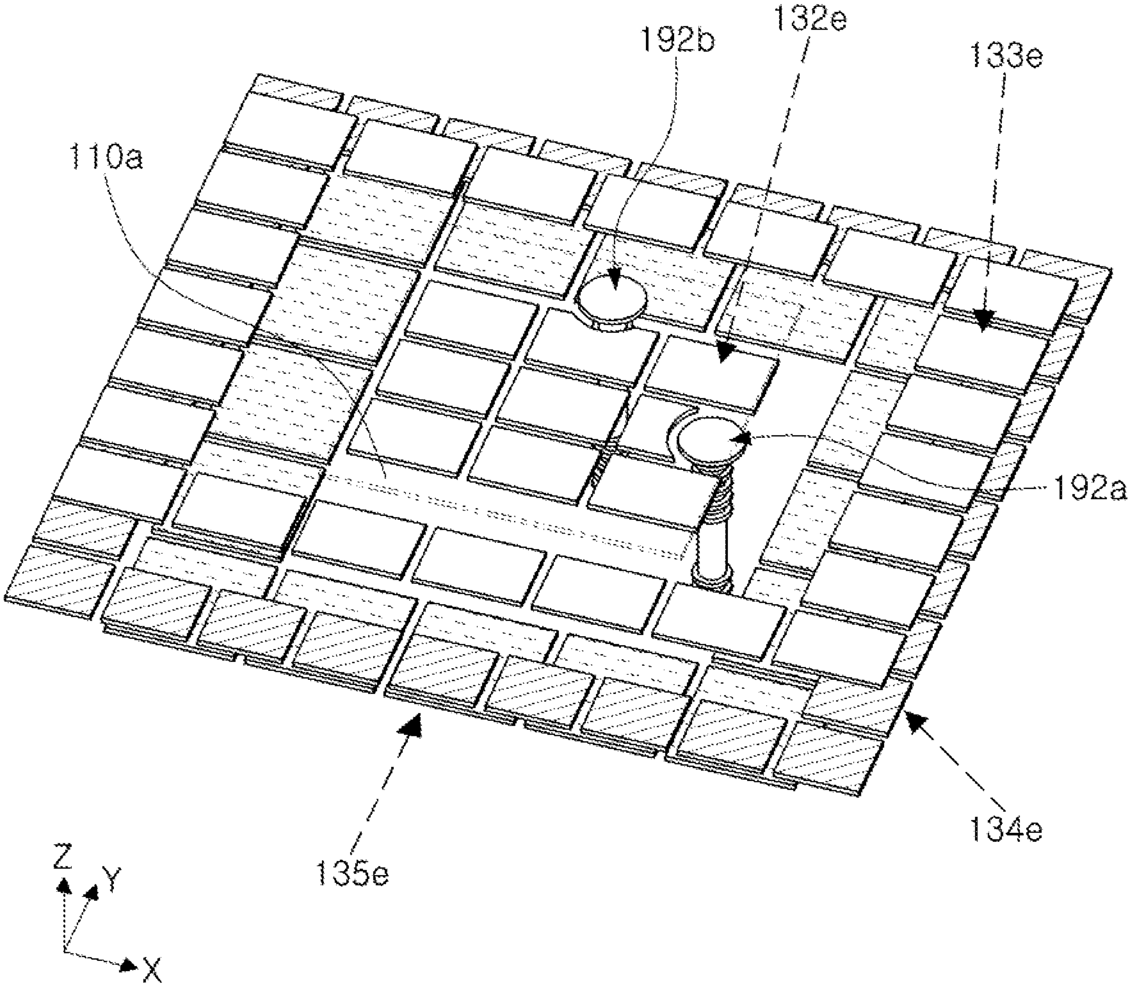
FIG. 2B is a perspective view illustrating various arrangement structures of a plurality of first and second coupling patterns of an antenna apparatus according to an example.

FIG. 2B is a perspective view illustrating various arrangement structures of a plurality of first and second coupling patterns of an antenna apparatus according to an example.

Referring to FIG. 2B, at least a portion of a 1-1th coupling pattern 132*e* of the plurality of first coupling patterns may overlap the patch antenna pattern 110*a* in the Z direction.

Areas of a 1-2th coupling pattern 133*e*, a 1-3th coupling pattern 134*e*, and a 1-4th coupling pattern 135*e* may be different from one another.

The structure of the plurality of first coupling patterns is not limited to the examples illustrated in FIGS. 1B through 2A.

Figure 3A:
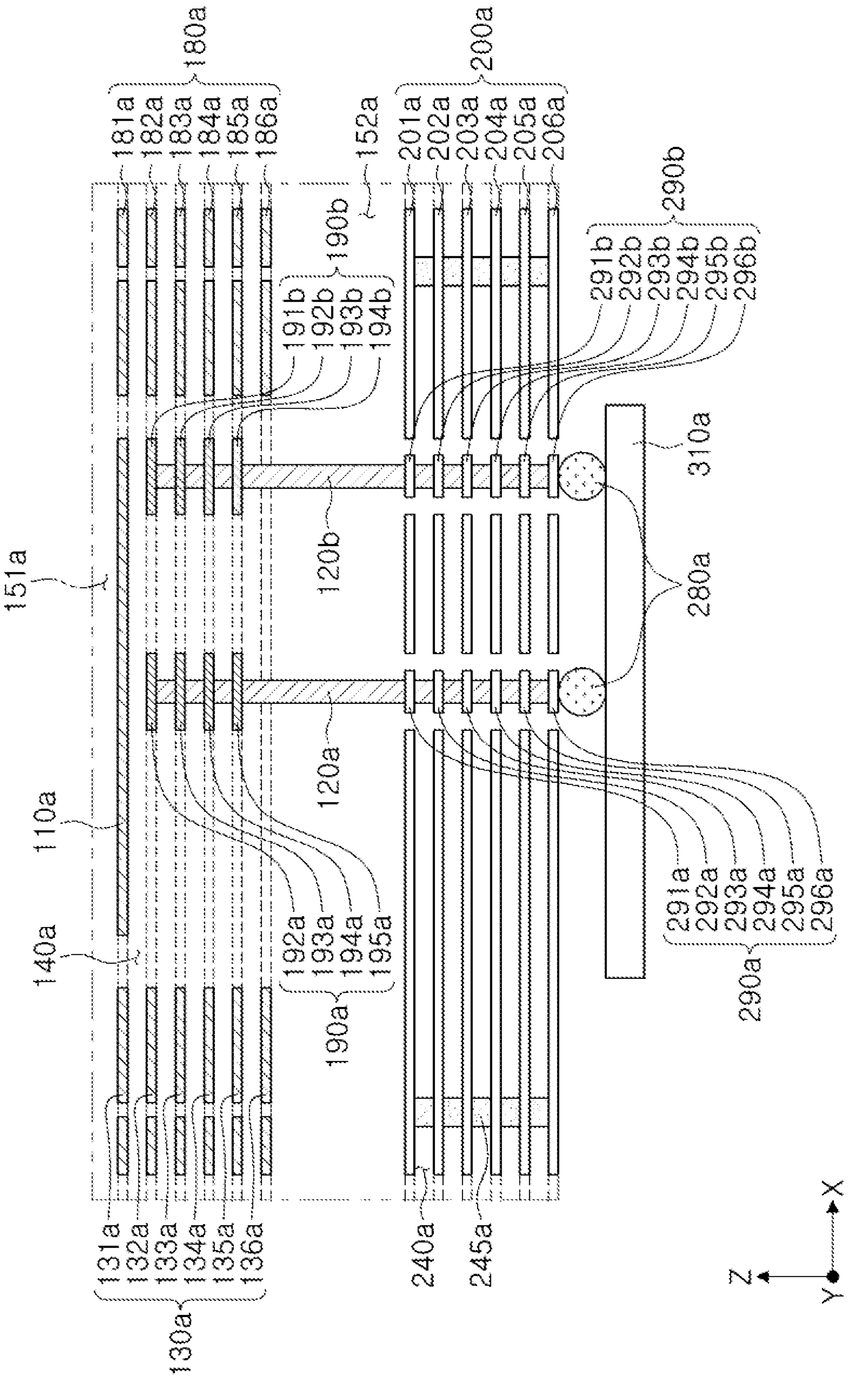
FIGS. 3A and 3B are side views illustrating an antenna apparatus according to an example.
Figure 3B:
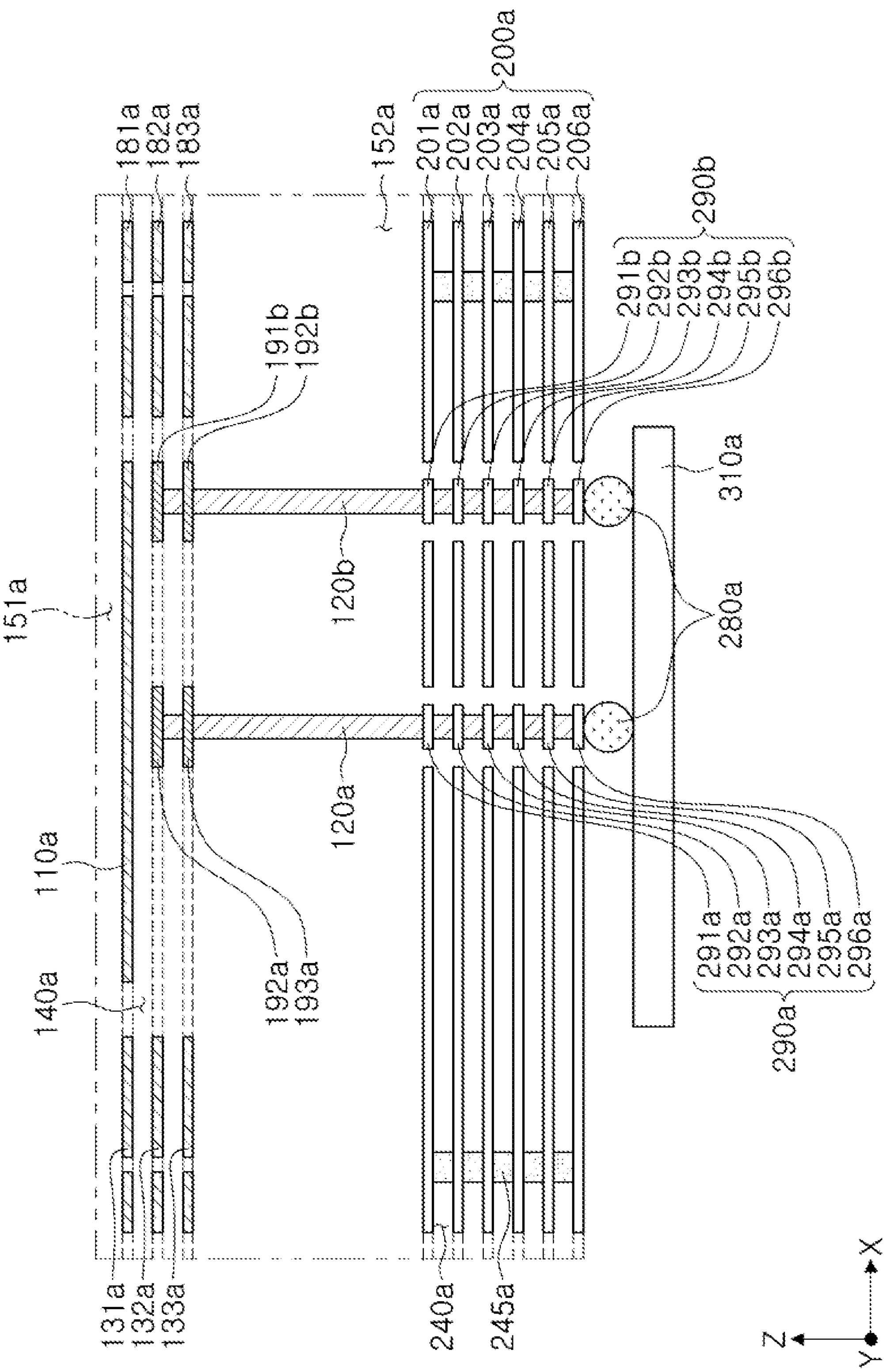

FIGS. 3A and 3B are side views illustrating an antenna apparatus according to an example.

Referring to FIGS. 3A and 3B, first and second feed vias 120*a* and 120*b* may be electrically connected to an IC 310*a* through an electrical interconnect structure 280*a*.

A connection member 200*a* may include a plurality of ground planes 201*a*, 202*a*, 203*a*, 204*a*, 205*a*, and 206*a*, and the first and second feed vias 120*a* and 120*b* may penetrate through through-holes of the plurality of ground planes 201*a*, 202*a*, 203*a*, 204*a*, 205*a*, and 206*a*.

Each of a plurality of first and second feed patterns 190*a* and 190*b* may have an area greater than an area of each of the through-holes of the plurality of ground planes 201*a*, 202*a*, 203*a*, 204*a*, 205*a*, and 206*a*. Accordingly, capacitance formed by the plurality of first and second feed patterns 190*a* and 190*b* and a patch antenna pattern 110*a* may greatly affect a resonance frequency of the patch antenna pattern 110*a*.

A plurality of first and second coupling patterns 130*a* and 180*a* may be electrically isolated from the plurality of ground planes 201*a*, 202*a*, 203*a*, 204*a*, 205*a*, and 206*a*. Accordingly, the plurality of first and second coupling patterns 130*a* and 180*a* may be intensively coupled to the patch antenna pattern 110*a*, thereby widening a bandwidth of the patch antenna pattern 110*a*.

A portion of the plurality of first coupling patterns 130*a* may be disposed on the same level (in the Z direction) as a level of the patch antenna pattern 110*a*, and the other portion of the plurality of first coupling patterns 130*a* may be disposed on the same level (in the Z direction) as a level of the plurality of first and second feed patterns 190*a* and 190*b*. Accordingly, the plurality of first coupling patterns 130*a* may effectively support an electromagnetic coupling between the patch antenna pattern 110*a* and the plurality of first and second feed patterns 190*a* and 190*b*.

The plurality of first and second coupling patterns 130*a* and 180*a* may be only disposed on the same level as or on a level lower than a level of the patch antenna pattern 110*a*. For example, the patch antenna pattern 110*a* may be disposed on the same level as a level of an uppermost coupling pattern of the plurality of first and second coupling patterns 130*a* and 180*a*.

Accordingly, an electromagnetic coupling of the patch antenna pattern 110*a* may be more concentrated on a lower side than an upper side (in the Z direction). Thus, the first and second feed patterns 190*a* and 190*b* may greatly affect a resonance frequency of the patch antenna pattern 110*a*. Accordingly, a gain and/or a bandwidth of the patch antenna pattern 110*a* may improve.

The connection member 200*a* may include a plurality of insulating layers 240*a* disposed between the plurality of ground planes 201*a*, 202*a*, 203*a*, 204*a*, 205*a*, and 206*a*. A plurality of vias 245*a* may connect the ground planes 201*a*, 202*a*, 203*a*, 204*a*, 205*a*, and 206*a*.

A core region 152*a* and a dielectric layer 140*a* may be disposed on an upper side of the connection member 200*a*, and the upper side may be encapsulated by an encapsulant 151*a*.

Figure 4A:
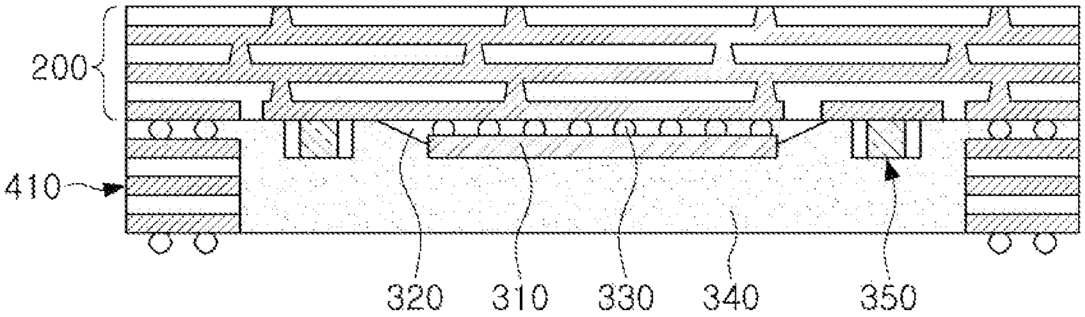
FIGS. 4A and 4B are views illustrating a connection member included in the antenna apparatus illustrated in FIGS. 1A to 3B and a lower structure of the connection member.
Figure 4B:
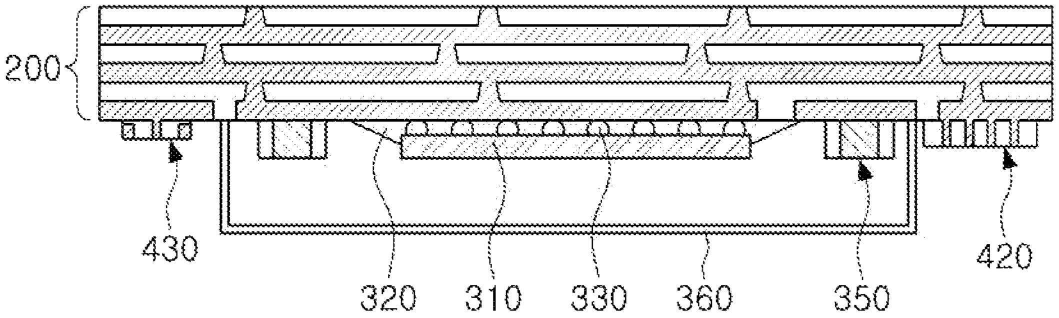

FIGS. 4A and 4B are views illustrating a connection member included in the antenna apparatus illustrated in FIGS. 1A through 3B and a lower structure of the connection member.

Referring to FIG. 4A, an antenna apparatus in the example may include at least portions of a connection member 200, an IC 310, an adhesive member 320, an electrical interconnect structure 330, an encapsulant 340, a passive component 350, and a sub-substrate 410.

The connection member 200 may have a structure similar to a structure of the connection member 200*a* described with reference to FIGS. 1A through 3B.

The IC 310 may be the same as the IC 310*a* described in the aforementioned examples, and may be disposed on a lower side of the connection member 200. The IC 310 may be electrically connected to a wiring line of the connection member 200 and may transmit or receive an RF signal. The IC 310 may also be electrically connected to a ground plane of the connection member 200 and may be provided with a ground. For example, the IC 310 may generate a converted signal by performing at least portions of frequency conversion, amplification, filtering, a phase control, and power generation.

The adhesive member 320 may allow the IC 310 and the connection member 200 to be adhered to each other.

The electrical interconnect structure 330 may electrically connect the IC 310 to the connection member 200. For example, the electrical interconnect structure 330 may have a structure such as a solder ball, a pin, a land, a pad, and the like. The electrical interconnect structure 330 may have a melting point lower than melting points of a wiring line and a ground plane of the connection member 200 and may electrically connect the IC 310 and the connection member 200 to each other through a required process using the low melting point.

The encapsulant 340 may encapsulate at least a portion of the IC 310, and may improve a heat dissipation performance and a protection performance against impacts. For example, the encapsulant 340 may be implemented by a photoimageable encapsulant (PIE), an Ajinomoto build-up film (ABF), an epoxy molding compound (EMC), and the like.

The passive component 350 may be disposed on a lower surface of the connection member 200, and may be electrically connected to a wiring line and/or a ground plane of the connection member 200 through the electrical interconnect structure 330.

The sub-substrate 410 may be disposed on a lower surface of the connection member 200, and may be electrically connected to the connection member 200 to receive an intermediate frequency (IF) signal or a baseband signal from an external entity and to transmit the signal to the IC 310, or to receive an IF signal or a baseband signal from the IC 310 and to transmit the signal to an external entity. A frequency (e.g., 24 GHz, 28 GHz, 36 GHz, 39 GHz, 60 GHz) of the RF signal may be greater than a frequency (e.g., 2 GHz, 5 GHz, 10 GHz, and the like) of the IF signal.

For example, the sub-substrate 410 may transmit an IF signal or a baseband signal to the IC 310 or may receive the signal from the IC 310 through a wiring line included in an IC ground plane of the connection member 200. As a first ground plane of the connection member 200 is disposed between the IC ground plane and a wiring line, an IF signal or a baseband signal and an RF signal may be electrically isolated from each other in an antenna module.

Referring to FIG. 4B, the antenna apparatus in the example may include at least portions of a shielding member 360, a connector 420, and a chip antenna 430.

The shielding member 360 may be disposed on a lower side of the connection member 200 and may enclose the IC 310 along with the connection member 200. For example, the shielding member 360 may cover or conformally shield the IC 310 and the passive component 350 together, or may separately cover or compartment-shield the IC 310 and the passive component 350. For example, the shielding member 360 may have a hexahedral shape in which one surface is open, and may have an accommodating space having a hexahedral form by being combined with the connection member 200. The shielding member 360 may be implemented by a material having relatively high conductivity such as copper such that the shielding member 360 may have a skin depth, and the shielding member 360 may be electrically connected to a ground plane of the connection member 200. Accordingly, the shielding member 360 may reduce electromagnetic noise which the IC 310 and the passive component 350 receive.

The connector 420 may have a connection structure of a cable (e.g., a coaxial cable or a flexible PCB), may be electrically connected to the IC ground plane of the connection member 200, and may work similarly to the above-described sub-substrate. Accordingly, the connector 420 may be provided with an IF signal, a baseband signal, and/or power from a cable, or may provide an IF signal and/or a baseband signal to a cable.

The chip antenna 430 may transmit or receive an RF signal in addition to the antenna apparatus. For example, the chip antenna 430 may include a dielectric block having a dielectric constant higher than that of an insulating layer, and a plurality of electrodes disposed on both surfaces of the dielectric block. One of the plurality of electrodes may be electrically connected to a wiring line of the connection member 200, and the other one of the plurality of electrodes may be electrically connected to a ground plane of the connection member 200.

Figure 5A:
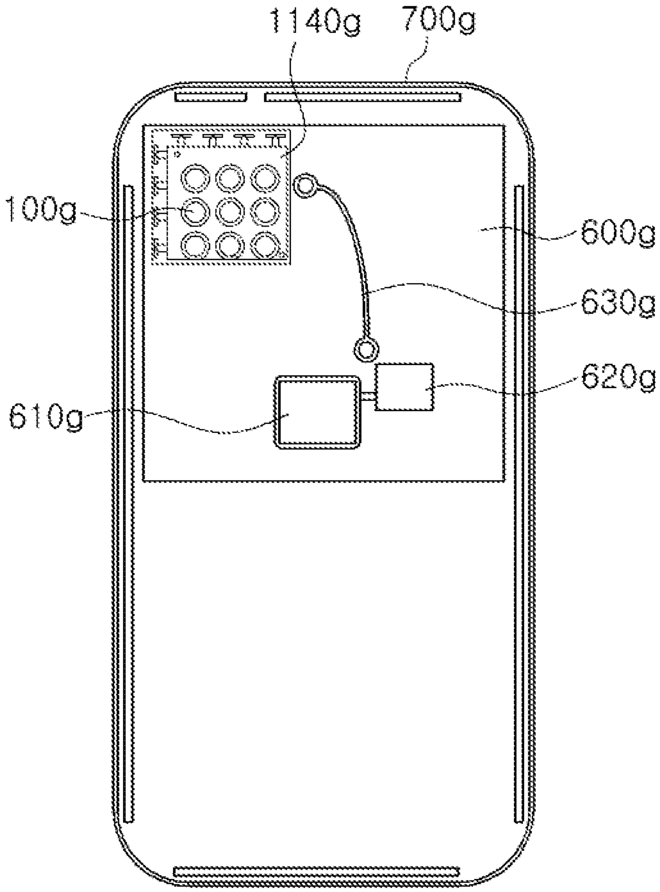
FIGS. 5A and 5B are plan views illustrating an example of an electronic device in which an antenna apparatus is disposed.
Figure 5B:
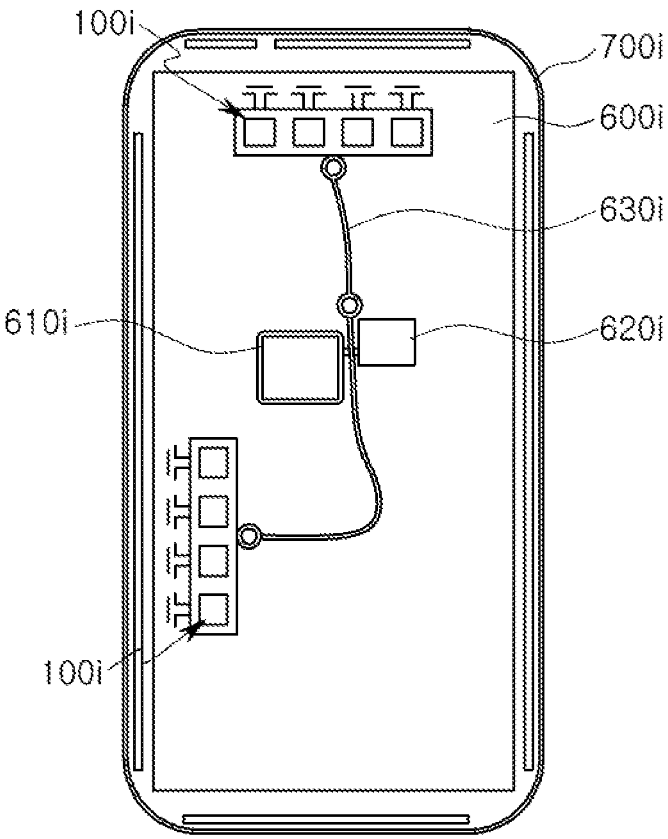

FIGS. 5A and 5B are plan views illustrating an example of an electronic device in which an antenna apparatus is disposed.

Referring to FIG. 5A, an antenna module including an antenna apparatus 100*g* may be disposed adjacent to a side surface boundary of an electronic device 700*g* on a set substrate 600*g* of the electronic device 700*g*. The antenna apparatus 100*g* may include a connection member 1140*g*.

The electronic device 700*g* may be implemented as a smartphone, a personal digital assistant, a digital video camera, a digital still camera, a network system, a computer, a monitor, a tablet PC, a laptop PC, a netbook PC, a television, a video game, a smart watch, an Automotive component, or the like, but an example of the electronic device 700*g* is not limited thereto.

A communication module 610*g* and a baseband circuit 620*g* may further be disposed on the set substrate 600*g*. The antenna module may be electrically connected to the communication module 610*g* and/or the baseband circuit 620*g* through a coaxial cable 630*g*.

The communication module 610*g* may include at least portions of a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital converter, an application-specific integrated circuit (ASIC), or the like.

The baseband circuit 620*g* may generate a base signal by performing analog-to-digital conversion, and amplification, filtering, and frequency conversion on an analog signal. A base signal input to and output from the baseband circuit 620*g* may be transferred to the antenna module through a cable.

For example, the base signal may be transferred to an IC through an electrical interconnect structure, a cover via, and a wiring line. The IC may convert the base signal into an RF signal of mmWave band.

Referring to FIG. 5B, a plurality of antenna modules each including an antenna apparatus 100*i* may be disposed adjacent to a center of a side of the electronic device 700*i* having a polygonal shape on a set substrate 600*i* of the electronic device 700*i*, and a communication module 610*i* and a baseband circuit 620*i* may further be disposed on the set substrate 600*i*. The antenna apparatus and the antenna module may be electrically connected to the communication module 610*i* and/or the baseband circuit 620*i* through a coaxial cable 630*i*.

The patch antenna pattern, the feed pattern, the feed via, the coupling pattern, the ground plane, the end-fire antenna pattern, and the an electrical interconnect structure described in the examples may include a metal material (e.g., a conductive material such as copper (Cu), aluminum (Al), silver (Ag), tin (Sn), gold (Au), nickel (Ni), lead (Pb), titanium (Ti), or alloys thereof), and may be formed by a plating method such as a chemical vapor deposition (CVD) method, a physical vapor deposition (PVD) method, a sputtering method, a subtractive method, an additive method, a semi-additive process (SAP), a modified semi-additive process (MSAP), or the like, but examples of the material and the method are not limited thereto.

The insulating layer described in the examples may be implemented by a material such as FR4, a liquid crystal polymer (LCP), low temperature co-fired ceramic (LTCC), a thermosetting resin such as an epoxy resin, a thermoplastic resin such as a polyimide resin, a resin in which the above-described resin is impregnated in a core material, such as a glass fiber (or a glass cloth or a glass fabric), together with an inorganic filler, prepreg, a Ajinomoto build-up film (ABF), FR-4, bismaleimide triazine (BT), a photoimagable dielectric (PID) resin, a general copper clad laminate (CCL), glass or a ceramic-based insulating material, or the like.

The RF signal described in the examples may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols, but an example thereof is not limited thereto.

According to the aforementioned examples, the antenna apparatus may provide a transmission and reception configuration for a plurality of different frequency bands, may improve an antenna performance (e.g., a gain, a bandwidth, directivity, a transmission and reception rate, and the like), and/or may be easily miniaturized.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna apparatus, comprising:

a patch antenna pattern;

a first feed via configured to feed power to the patch antenna pattern in a non-contact manner on a first side of the patch antenna pattern;

a second feed via configured to feed power to the patch antenna pattern in a non-contact manner on a second side of the patch antenna pattern;

a plurality of first feed patterns disposed on the first side of the patch antenna pattern on different levels and overlapping each other, and including at least one feed pattern that is electrically connected to the first feed via, each of the first feed patterns having a width greater than a width of the first feed via and a cross-sectional area smaller than a cross-sectional area of the patch antenna pattern; and a plurality of second feed patterns disposed on the second side of the patch antenna pattern on different levels and overlapping each other, wherein the plurality of first feed patterns is spaced apart from the plurality of second feed patterns, wherein the patch antenna pattern is spaced apart from a highest first feed pattern of the first feed patterns and spaced apart from a highest second feed pattern of the second feed patterns without conductive patterns therebetween in a thickness direction of the antenna apparatus, and wherein the plurality of first feed patterns do not overlap the plurality of second feed patterns in the thickness direction of the antenna apparatus.

2. The antenna apparatus of claim 1, wherein the second feed via is disposed adjacent a first edge of the patch antenna pattern offset from a center of the patch antenna pattern in a second direction, wherein the first feed via is disposed adjacent to a second edge of the patch antenna pattern offset from the center of the patch antenna pattern in a first direction different from the second direction.

3. The antenna apparatus of claim 1, further comprising:

a ground plane comprising a through-hole through which the first feed via penetrates, and disposed on the first side of the patch antenna pattern on a level spaced farther away from the patch antenna apparatus than at least one of the plurality of first and second feed patterns.

4. The antenna apparatus of claim 3, wherein the cross-sectional area of each of the plurality of first feed patterns is greater than a cross-sectional area of the through-hole.

5. The antenna apparatus of claim 1, wherein the cross-sectional areas of the plurality of first feed patterns are different from each other.

6. The antenna apparatus of claim 5, further comprising:

a ground plane comprising a through-hole through which the first feed via penetrates, wherein the plurality of first feed patterns includes at least one feed pattern disposed in the through-hole having a cross-sectional area smaller than at least one feed pattern not disposed in the through-hole.

7. An antenna apparatus, comprising:

a patch antenna pattern;

a first feed via configured to feed power to the patch antenna pattern in a non-contact manner on a first side of the patch antenna pattern;

a second feed via configured to feed power to the patch antenna pattern in a non-contact manner on a second side of the patch antenna pattern;

a plurality of first feed patterns disposed on the first side of the patch antenna pattern on different levels and overlapping each other, and including at least one feed pattern that is electrically connected to the first feed via, each of the first feed patterns having a width greater than a width of the first feed via and a cross-sectional area smaller than a cross-sectional area of the patch antenna pattern;

a plurality of second feed patterns disposed on the second side of the patch antenna pattern on different levels and overlapping each other; and a plurality of first coupling patterns disposed on different levels and overlapping each other, and arranged to surround the patch antenna pattern, wherein the plurality of first feed patterns is spaced apart from the plurality of second feed patterns, wherein at least one coupling pattern of the plurality of first coupling patterns is disposed on a same level as a level of the patch antenna pattern, and wherein the plurality of first coupling patterns other than the at least one coupling pattern are disposed on the first side of the patch antenna pattern on levels corresponding to the different levels of the plurality of first feed patterns.

8. The antenna apparatus of claim 7, further comprising:

a plurality of second coupling patterns disposed on different levels and overlapping each other, and arranged to surround the plurality of first coupling patterns.

9. The antenna apparatus of claim 8, wherein the plurality of first and second coupling patterns are disposed only on a same level as the patch antenna pattern or on levels spaced apart from the first side of the patch antenna pattern.

10. The antenna apparatus of claim 8, further comprising:

a ground plane comprising a through-hole through which the first feed via penetrates and disposed on the first side of the patch antenna pattern on a level spaced farther away from the patch antenna apparatus the plurality of feed patterns, wherein the plurality of first coupling patterns and the plurality of second coupling patterns are electrically disconnected from the ground plane.

11. The antenna apparatus of claim 8, wherein a cross-sectional area of each of the plurality of first coupling patterns is different from a cross-sectional area of each of the plurality of second coupling patterns.

12. The antenna apparatus of claim 11, wherein the patch antenna pattern includes a plurality of patch antenna patterns, wherein the plurality of patch antenna patterns is arranged in an N×1 structure in a first direction normal to a thickness direction of the patch antenna patterns or a second direction normal to a thickness direction of the patch antenna patterns and the first direction, where N is a natural number greater than or equal to 2, and wherein the plurality of first coupling patterns is divided into a plurality of groups, and the plurality of groups of the first coupling patterns surround each of the plurality of patch antenna patterns.

13. The antenna apparatus of claim 12, wherein the plurality of groups of the plurality of first coupling patterns are spaced apart from each other by a length greater than a length of a spacing distance between the plurality of first coupling patterns, and wherein at least a portion of the plurality of second coupling patterns is disposed between the plurality of groups of the plurality of first coupling patterns.

14. The antenna apparatus of claim 12, further comprising:

a plurality of end-fire antenna patterns spaced apart from the plurality of patch antenna patterns in the first direction and arranged in the second direction.

15. The antenna apparatus of claim 12, wherein the cross-sectional area of a first coupling pattern of the plurality of first coupling patterns spaced apart from the patch antenna patterns in the first direction is less than the cross-sectional area of a second coupling pattern of the plurality of second coupling patterns spaced apart from the patch antenna patterns in the first direction, and wherein the cross-sectional area of a first coupling pattern of the plurality of first coupling patterns spaced apart from the patch antenna patterns in the second direction is greater than the cross-sectional area of a second coupling pattern of the plurality of second coupling patterns spaced apart from the patch antenna patterns in the second direction.

* * * * *